United States Patent [19]

Blossfeld

[11] Patent Number: 4,550,490

[45] Date of Patent: Nov. 5, 1985

[54] MONOLITHIC INTEGRATED CIRCUIT

[75] Inventor: Lothar Blossfeld, Freiburg-Hochdorf, Fed. Rep. of Germany

[73] Assignee: ITT Industries, Inc., New York, N.Y.

[21] Appl. No.: 599,946

[22] Filed: Apr. 13, 1984

[30] Foreign Application Priority Data

Apr. 18, 1983 [EP] European Pat. Off. ........ 83103719.7

[51] Int. Cl.$^4$ ........................................... H01L 21/265
[52] U.S. Cl. ..................................... 29/571; 29/576 B; 29/577 C; 148/187
[58] Field of Search ................. 29/571, 576 B, 577 C; 148/187

[56] References Cited

U.S. PATENT DOCUMENTS

| 3,745,425 | 7/1973 | Beale et al. | 148/187 X |
| 4,346,512 | 8/1982 | Liang et al. | 29/577 C |
| 4,382,826 | 5/1983 | Pfleiderer et al. | 29/571 X |
| 4,475,279 | 10/1984 | Gahle | 29/571 X |
| 4,477,965 | 10/1984 | Blossfeld | 148/1.5 X |
| 4,483,738 | 11/1984 | Blossfeld | 148/187 X |

FOREIGN PATENT DOCUMENTS 0071665 2/1983 European Pat. Off. .
1564411 7/1969 Fed. Rep. of Germany .

Primary Examiner—George T. Ozaki
Attorney, Agent, or Firm—Donald J. Lenkszus

[57] ABSTRACT

A method of producing an integrated insulated-gate field-effect transistor with an increased breakdown voltage provides in that at least one of the two zones, i.e. the source zone and/or the drain zone is surrounded by a relatively high-ohmic partial zone. This partial zone or the partial zones are first produced by way of ion implantation with the aid of a first implantation mask. After removal of this mask, the entire area of the field-effect transistor is covered with an oxidation masking layer comprising several selectively etchable partial layers, of which the lower partial layer is finally exposed and serves as the gate insulating layer. With the aid of the photoresist mask serving as an etching mask, openings are etched through the oxidation masking layer. The photoresist mask, together with the portions of the oxidation masking layer remaining therebelow, is used as an ion implantation mask for manufacturing both the source zone and the drain zone.

4 Claims, 7 Drawing Figures

MONOLITHIC INTEGRATED CIRCUIT

BACKGROUND OF THE INVENTION

This invention pertain to a monolithic integrated circuit having at least one integrated insulated-gate field-effect transistor.

DE-OS No. 15 64 411 describes an insulated-gate field-effect transistor in which a drain zone of a first conductivity type is produced in a surface of a semiconducting substrate of a second conductivity type. The drain zone is surrounded by a more weakly doped partial zone of the second conductivity type. The purpose of the partial zone is to achieve a relatively low output capacity and a lower alteration speed of the depletion layer width within the substrate area.

Such a field-effect transistor has an increased breakdown voltage.

SUMMARY OF THE INVENTION

It is an object of the invention to provide a method which permits the manufacture of a monolithic integrated circuit having at least one such insulated-gate field-effect transistor with an increased drain and/or source breakdown voltage.

The invention relates to a method of producing a monolithic circuit having at least one integrated insulated-gate field-effect transistor whose drain zone and whose source zone of the second conductivity type are introduced into one surface of a semiconducting substrate of the first conductivity type, with at least one of the zones being surrounded by a more weakly doped partial zone of the second conductivity type.

A method in accordance with the invention, is compatible with a method which permits the manufacture of a monolithic integrated circuit comprising planar bipolar transistors of the type described in prior published European patent application No. 0071 665. In this conventional bipolar transistor manufacturing method, following the manufacture of the collector zones, an oxidation masking layer portion consisting of selectively etchable partial layers, is produced on the emitter area and is used as a selectively effective implantation mask during the implantations of the dopings of the base zone having a thinner base zone portion and a thicker outer base zone portion.

In one embodiment of the method according to the invention further developed as an improvement over the aforementioned method of manufacturing integrated circuits comprising planar bipolar transistors, there is likewise deposited an oxidation masking layer consisting of selectively etchable partial layers. All the partial layers thereof or at least the bottom partial layer, are or is used as a gate insulating layer of the high blocking insulated-gate field-effect transistor, and are correspondingly dimensioned with respect to their thicknesses. In this way one portion of the layer structure can not only serve as an oxidation masking layer and, at least partially, as a gate insulating layer, but is also used as an ion masking layer in the course of manufacturing the base zones of bipolar transistors having one thinner, inner base zone portion and one thicker, outer base zone portion. The diffusion of the drain-partial zone and/or of the source-partial zone can be easily combined with the collector zone diffusion and the diffusion of the actual low-ohmic drain zone and/or source zone can be combined with the emitter zone diffusion.

Accordingly, one outstanding advantage of the method according to the invention is that it is capable of being combined with the conventional method as disclosed in the aforementioned European patent application No. 0071 665, by means of a few additional processing steps.

Therefore, the embodiment to be described hereinafter with reference to the figures of the accompanying drawings, simultaneously also serves to describe this combination relating to the manufacture of a monolithic integrated circuit having a high breakdown voltage insulated-gate field-effect transistor in which the source zone, as well as the drain zone are each surrounded by one partial zne, and having a planar bipolar transistor. The conductivity types described are preferable over conductivity types of opposite sign.

DETAILED DESCRIPTION

In accordance with of the invention, monolithic integrated solid-state circuits with almost ay optional number of field-effect transistors as well as also bipolar transistors can be manufactured. Since, with the method according to the invention integrated MOS circuits without bipolar transistors are also capable of being manufactured, the following description first describes the method according to the invention with reference to the parts B of the drawings.

The method starts from a p conductivity type substrate 1 of silicon on which, with the aid of a first photoresist mask M1, there is formed a first ion masking layer 81. For this purpose, the substrate may be oxidized. From the resulting oxide layer and with the aid of a first photoresist mask M1, there may be formed an ion masking layer of silicon oxide. In the embodiment, however, the photoresist mask M1 is directly used as the ion masking layer 81.

Although it is sufficient in many applications to design only the drain pn junction in a high blocking manner, it is suitable to also obtain a high blocking source pn junction. For this reason the source zone as well as the drain zone are each surrounded by a high-ohmic partial zone. Accordingly, both partial zone areas 32 and 42 of the partial zones 31 and 41 to be manufactured are exposed. Into these partial zone areas 32, 42 of the substrate surface are implanted ions of the second conductivity type, i.e., of n-conductivity type, at a dose rate corresponding to the doping of the partial zones 31 and 41. The ion masking layer 81 is removed thereafter.

Figure 2:
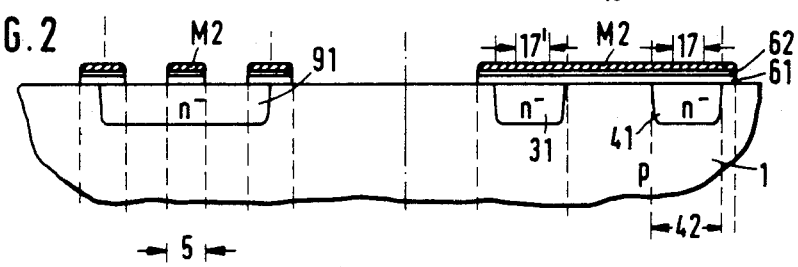

For the purpose of forming the zones 31, 41 and of activating the dopings, the substrate is now annealed and oxidation masking layers 61, 62 are produced throughout the entire substrate surface, on which then a layer of photoresist is deposited. This layer is exposed in the conventional way with the aid of a photographic mask, so that in accordance with the conventional photolithographic technique, the second photoresist mask M2 is produced which covers the entire area 10 of the field-effect transistor including the pn junction areas 14, as is shown in FIG. 2. The width of the pn junction areas 14 is to be dimensioned in accordance with the intended drain-substrate breakdown voltage. Following the application of a two-stage plasma etching process, in the course of which the photoresist mask M1 acts as an etching mask, there is obtained the structure as shown in FIG. 2.

The oxidation masking layers 61, 62 includes at least of a lower partial layer 61 and an upper partial layer 62, so that the selective etchability requirements can be met with respect to the layers for complying with the conditions of the method according to the invention which are otherwise difficult to be adapted to one another, especially considering the thickness of the gate insulating layer. Preferably, there is deposited a lower partial layer 61 of silicon dioxide and an upper partial layer 62 of silicon nitride. If, for example, the lower partial layer is the gate insulating layer, the latter will have to be adapted with respect to its thickness to the desired threshold value which, at a later stage, is still capable of being modified by way of an ion implantation through the gate insulating layer.

Figure 4:
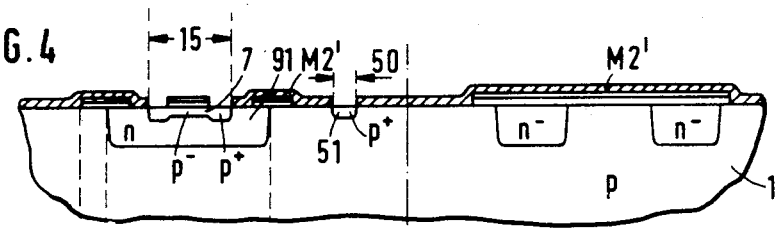

FIG. 4 refers to the aforementioned further embodiment of the method according to the invention with a view to the manufacture of a bipolar transistor, and explains operating steps which are not necessary for manufacturing the insulated-gate field-effect transistor. Therefore a description relative to FIG. 4 may be skipped for the time being.

Figure 5:
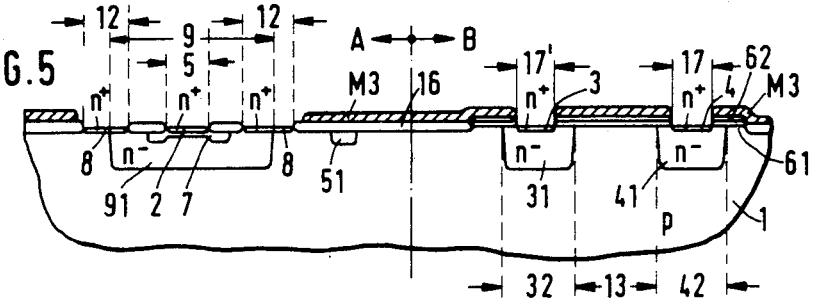

In the method according to the invention, following the deposition of the oxidation masking layers 61 and 62, as has been described with reference to FIG. 3 there is oxidized at a later stage the free substrate surface by forming the oxide layer 16 as shown in FIG. 5. A third photoresist mask M3 is deposited to serve as the etching mask. Photoresist mask M3, within the partial zone areas 32 and 42, has openings corresponding to the zone areas 17, 17' which are disposed within the partial zone areas 32 and 42. The spacings of the rim portions of the zone areas 17 or 17' from the rim portions of the partial zone areas 32 or 42 are to be chosen so large that the space-charge regions of the pn junctions can freely expand in direction towards the zones 3, 4 which are subsequently manufactured.

Into the already doped partial zone areas 31 and 41, by employing the third photoresist mask M3 as an implantation mask, are now implanted ions of the second conductivity type in a sufficiently large dose to form zones 3, 4. This results in an arrangement as shown in part B of FIG. 5.

Figure 6:
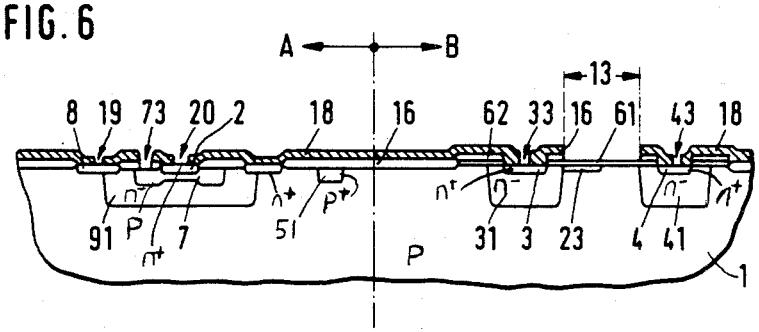

Following the removal of the third photoresist mask M3, the surface of the arrangement including the oxide layer 16 and the oxide masking layers 61, 62 is covered with the oxide layer 18. After annealing of the arrangement to activate the dopings a fourth photoresist mask is deposited having openings towards the zones 3, 4 which are spaced from the rim portions thereof in accordance with the aforementioned dimensioning rule, and spaced apart from the part of the remaining oxidation masking layer above the gate area 13, as is illustrated in FIG. 6. To simplify the representation in FIG. 6, the fourth photoresist mask has been omitted, with the structure thereof, of course, being in agreement with the structure of the foreign-oxide layer 18 serving as the contacting mask.

Following etching out of the openings 13, 33 and 43, and in cases where only the partial layer 61 is intended to be used as a gate insulator, the upper partial layer 62 consisting of silicon nitride is selectively removed by plasma etching, so that by employing the fourth photoresist mask together with the foreign oxide layer 18 as the etching mask, the gate oxide layer is now exposed. This layer has previously been protected by the nitride layer lying thereon. The opening 13 must in the conventional way overlap the zones 31, 41 (not illustrated in FIG. 6).

By employing a further photoresist mask serving as the implantation mask (not illustrated in FIG. 6), ions can now be implanted through the gate oxide layer for adjusting the threshold voltage of the field-effect transistor. It is advantageous to restrict such an implantation to the area 23 of the gate area 13 adjacent to the partial zone 31 of the source zone 3 by using a special implantation mask. Finally, referring to FIG. 7, by using a sixth photoresist mask (not illustrated in FIG. 7), the electrodes 32, 42 at the zones 3 or 4, and the gate electrode 22 are etched in the conventional way out of a conducting layer deposited onto the surface of the arrangement.

The entire oxidation masking layer within the gate area 13 or any suitable number of selectively etchable partial layers may also be used as the gate insulating layer.

Figure 1:
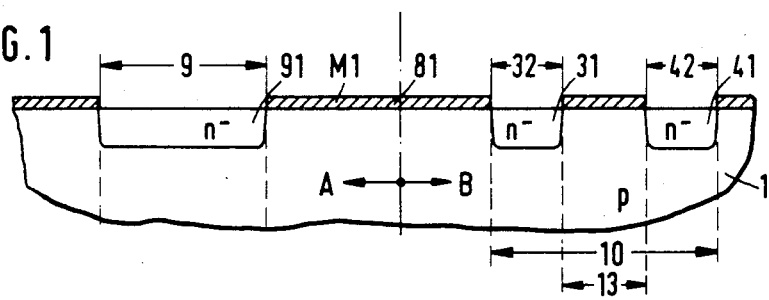
FIGS. 1 to 7 of the accompanying drawings which serve to explain successively following manufacturing stages in a method according to the invention, show in section a monolithic solid-state circuit in the usual representation. Part A of the drawings relates to the manufacture of an integrated bipolar transistor, whereas part B of the drawings explain the manufacture of a highly nontransmitting insulataed-gate field-effect transistor according to the invention.

In a further embodiment of the method according to the invention a first ion masking layer 81 is initially formed on the substrate 1 with the aid of a first photoresist mask M1 which, except for at least one of the partial zone areas 31 and 41, leaves uncovered the collector zone area 9 of a planar bipolar transistor shown in part A of the drawings, as illustrated in FIG. 1.

Thereafter, ions of the second conductivity type are implanted into the non-covered portions 91 of the substrate surface, ion masking layer 81 is removed and substrate is annealed in accordance with the embodiment described hereinbefore.

Next, referring to FIG. 2, a second photoresist mask M2 is produced. With the aid of Mask M2, oxidation masking layers 61, 62 are applied which, except for the entire area 13 of the field-effect transistor including the pn junction area 14, covers the emitter area 5 and the collector contacting area 12 of the bipolar transistor.

The thickness of the oxidation masking layer is a special way, as is known from the aforementioned European patent application No. 0071 665. According to this prior application, the thickness of the oxidation masking layer is to be dimensioned such that, in the course of a first one of two implantation processes to be carried out in any optional order of succession, the ion masking layer is penetrated by the ions, and the accelerating voltage in the course of the second ion implantation process is restricted to such relatively small values as such that the ions are masked. During the first ion implantation process which is carried out with a small dose, for example, between $2 \times 10^{12} cm^{-2}$ and $5 \times 10^{13} cm^{-2}$, ions are implanted into the inner as well as into the outer base area. During the ion implantation process which is carried out at a relatively low accelerating energy, e.g., at less than 100 keV, only the outer base area is doped.

Figure 3:
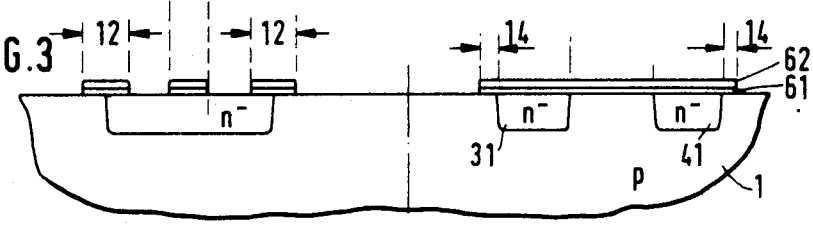

The second photoresist mask M2 is removed as indicated in FIG. 3. Both implantation processes are then carried out with the aid of a photoresist mask M2' capable of being used as an implantation mask. The photoresist mask M2' masks the entire area 13 of the insulated-gate field-effect transistor and pn junction area 14 or both junction areas 14 and 14' leaving free the base area 15 of the bipolar transistor, as is shown in FIG. 4. For the purpose of illustrating the effects of the two ion implantation processes, the base zone 7 is represented in a stepped manner in FIG. 4, although this stepped shape of the base zone is only later on in the course of a high-temperature process and following the activation of the implanted dopings. FIG. 4 shows a particular embodiment of the photoresist mask M2' having an opening 50 which serves to produce the channel interrupting zone 51 by making use of the two aforementioned implantation processes.

Thereafter, the photoresist mask M2' which is capable of being used as an implantation mask, is carefully removed. Then the exposed substrate surface is oxidized by forming the oxide layer 16 extending throughout all of those parts of the substrate surface which are not protected by the oxidation masking layer 61,62.

Subsequently thereto, the third photoresist mask M3 is deposited. Photoresist mask M3, as can be seen from FIG. 5, includes openings for exposing the substrate surface within the zone areas 17 and 17' or the opening within the zone area 17 only, and includes an opening which leaves uncovered at least the collector area 9 and the collector contacting area 12. Following use of the third photoresist mask M3 as an etching mask, the exposed portions of the oxidation masking layer 61, 62 in the zone areas 17, 17' or in the zone area 17 and within the emitter area 5 and within the collector contacting area 12 are removed.

Ions of the second conductivity type are implanted into the exposed areas of the substrate surface. The third photoresist mask M3 is removed. A annealing of the emitter zone 2 results in the preferably frame-shaped collector contacting zone 8 with the exception of the zones 3 and 4, as can be seen from FIG. 5.

The entire surface of the arrangement is now covered with the oxide layer 18 on which, subsequently to the annealing, there is deposited a fourth photoresist mask (not illustrated in FIG. 5) comprising the openings 19, 20, 73, 33 and 43 in the zones 8, 2, 7, 3 and 4, respectively at certain distances from the rim portions thereof. Moreover, this fourth photomask still contains an opening extending to the gate area 13. After this, and by employing an implantation mask for adjusting the characteristic properties, dopants can be implanted into the gate area 13 through the gate insulating layer (FIG. 6). It is favorable to implant a doping area 23 which is doped higher than the gate area 13, adjacent to the source partial zone 31 and overlapping therewith, and which extends almost over one half the distance to the drain partial zone 41. This doping area 23, of course, can also be implanted after the first ion masking layer 81 has been removed, as shown in FIG. 1, by employing a special ion masking layer.

Figure 7:
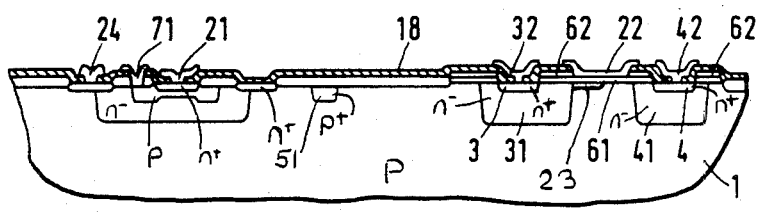

After removal of the foreign-oxide layer 18 within the openings of the fourth photoresist mask, there is deposited in conventional manner a conducting layer which is topped by a fifth photoresist mask (not illustrated) having such a structure that the necessary electrodes 32, 42, 22, 21, 24 and 71 as shown in FIG. 7, can be etched out of the applied conductive layer.

What is claimed is:

1. A method of producing a monolithic integrated circuit comprising at least one integrated insulated-gate field-effect transistor whose drain zone and whose source zone of a second conductivity type are introduced into one surface of a semiconducting substrate of a first conductivity type, with at least one of said source or drain zones being surrounded by a partial zone of said second conductivity type which is doped weaker than said source or drain zones, said method comprising the steps of:
    (a) forming a first ion masking layer on said substrate surface, with the aid of a first photoresist mask, said ion masking layer having openings over at least one partial zone area of said partial zones or the partial zone to provide non-covered portions of said substrate surface;
    (b) implanting into said non-covered portions of the substrate surface ions of said second conductivity type in a dose corresponding to the doping of said partial zones;
    (c) removing said first ion masking layer;
    (d) annealing said substrate;
    (e) producing an oxidation masking layer by employing a second photoresist mask, said oxidation masking layer covering the entire area of said field-effect transistor including the pn junction areas of the produced partial zones or partial zone only, said oxidation masking layer including at least a lower partial layer adjoining said substrate surface and an upper partial layer, said lower and upper partial layers being selectively etchable, and of which at least the lower partial layer is capable of being used as a gate insulating layer;
    (f) oxidizing the unmasked portions of said substrate surface by forming an oxide layer;
    (g) depositing a third photoresist mask;
    (h) using said third photoresist mask as an etching mask, to expose a first zone area within a first one of said partial zone areas and/or a second zone area within a second one of said partial zone area of said substrate surface;
    (i) employing said third photoresist mask as an implantation mask and implanting ions of said second conductivity type in a dose corresponding to the doping of said zones into the already implanted areas;
    (j) removing said third photoresist mask;
    (k) covering the surface of the arrangement including the oxide layer and the masking layer with a foreign oxide layer;
    (l) activating the dopings by annealing;
    (m) depositing a fourth photoresist mask comprising openings extending to said zones at predetermined distances in relation to the rim portions thereof, and to the portion of said oxidation masking layer lying above the gate area;
    (n) removing the foreign-oxide layer within the openings of the fourth photoresist mask by etching selectively down to said upper partial layer or down to said lower partial layer and, within said zone area of said zone areas down to the said zones for the purpose of forming contact openings;
    (o) depositing a conductive layer;
    (p) depositing a fifth photoresist mask; and
    (q) utilizing said fifth photoresist mask for etching at least electrodes out of said conductive layer.

2. A method as claimed in claim 1, wherein
said first ion masking layer includes further openings for the collector zone area of a planar bipolar transistor;
said oxidation masking layer of step (e) covers the emitter area and the collector contacting area of such thickness that said oxidation mask layer, in the course of a first implantation process, with a small dose and a relatively high accelerating voltage of doping ions of the conductivity type of the base zone is transmissive and, in the course of a second implantation process of a relatively low accelerating voltage of ions of the same conductivity type, effects a masking;

intermediate between steps (e) and (f) the following additional steps are performed:

depositing an additional photoresist mask which is capable of being used as an implantation mask, said mask covering the entire area of the insulated-gate field-effect transistor and one pn junction area or both junction areas and having an opening over the base area;

removing said additional photoresist mask;

wherein said third photoresist mask comprises an opening which leaves uncovered at least said collector area and a collector contacting area so that during step (h) said third photoresist mask is used as an etching mask, said oxide layer is also removed within both the emitter area and said collector contacting area; and said fourth photoresist mask comprising openings extending to said emitter area and said collector contacting area at predetermined distances from the rim portions thereof.

3. A method as claimed in claim 1 wherein said oxidation masking layer includes a lower partial layer of silicon dioxide and of an upper partial layer of silicon nitride.

4. A method as claimed in claim 2 wherein said oxidation masking layer includes a lower partial layer of silicon dioxide and of an upper partial layer of silicon nitride.

* * * * *